United States Patent [19]

Panasik et al.

[11] Patent Number: 5,111,168

[45] Date of Patent: May 5, 1992

[54] REAL-TIME, IN-SITU SAW FILTER DELAY ADJUSTMENT

[75] Inventors: Carl M. Panasik, Garland; Patrick J. Wilde, Decatur; Betty L. James, Grapevine, all of Tex.

[73] Assignee: Texas Instruments Incorporated, Dallas, Tex.

[21] Appl. No.: 567,831

[22] Filed: Aug. 15, 1990

[51] Int. Cl.⁵ .................. H03H 9/42; H03H 9/68
[52] U.S. Cl. .................. 333/152; 333/153; 310/313 D; 29/25.25
[58] Field of Search ............... 333/150–154, 333/193–196; 310/313 R, 313 B, 313 C, 313 D; 29/25.35

[56] References Cited

U.S. PATENT DOCUMENTS

| | | | |
|---|---|---|---|
| 4,097,825 | 6/1978 | Gerard | 333/153 X |
| 4,130,813 | 12/1978 | Sandy et al. | 333/195 X |
| 4,364,016 | 12/1982 | Tanski | 333/150 X |
| 4,442,574 | 4/1984 | Wanuga et al. | 29/25.35 |
| 4,598,224 | 7/1986 | Ballato | 333/153 X |
| 4,634,914 | 1/1987 | Ballato | 333/195 X |

Primary Examiner—Eugene R. Laroche
Assistant Examiner—Seung Ham
Attorney, Agent, or Firm—René E. Grossman; Richard L. Donaldson

[57] ABSTRACT

A method of adjusting the center frequency of a SAW device by providing a substrate capable of propagating a surface acoustic wave thereon having input transducer electrode on one end portion thereof, output transducer electrodes on the opposite end portion thereof and a waveguide portion therebetween, applying an RF input signal to the input transducer and providing an indication of the output obtained from the output transducer and etching the entire device with an etchant until the indication has reached a predetermined status. According to a second embodiment, the delay of a SAW device is adjusted by providing a substrate capable of propagating a surface acoustic wave thereon having an input transducer portion on one end portion thereof, an output transducer portion on the opposite end portion thereof and a waveguide portion therebetween, masking the input and output transducer portions and providing an exposed area over the waveguide portion, applying an RF input signal to the input transducer and providing an indication of the output obtained from the output transducer and etching the pattern in the unmasked poriton of the waveguide with an etchant until the indication has reached a predetermined status.

15 Claims, 1 Drawing Sheet

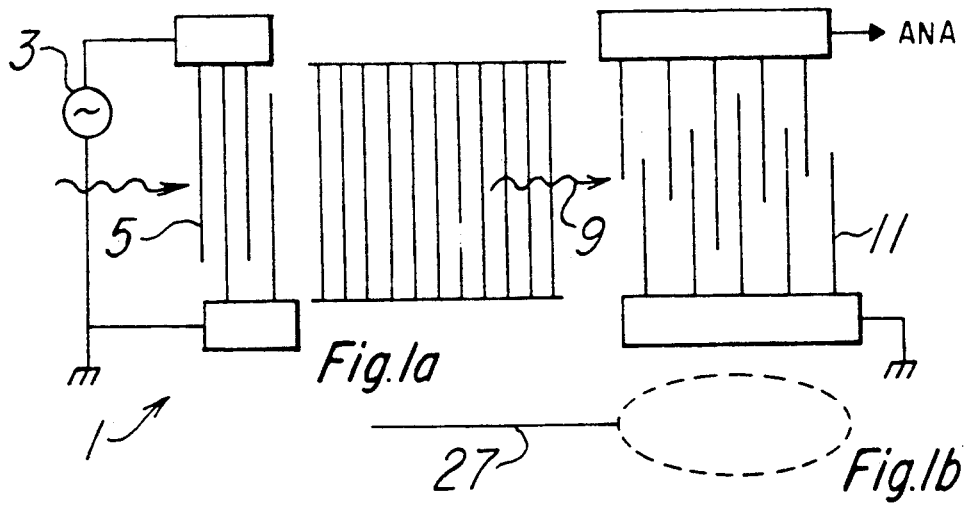
Fig.1a
Fig.1b
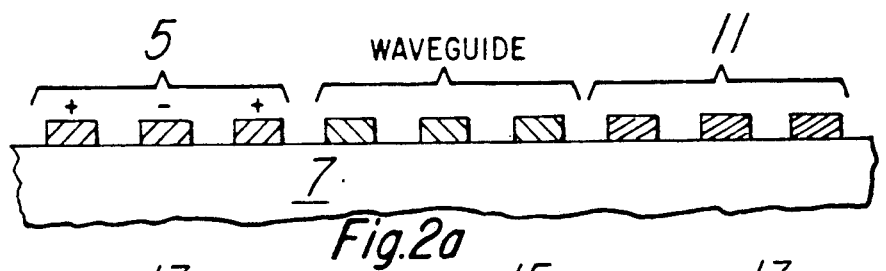
Fig.2a
Fig.2b
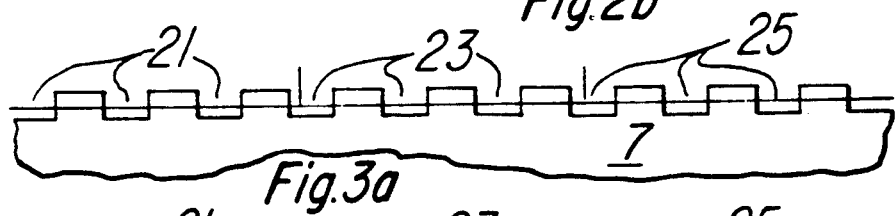
Fig.3a
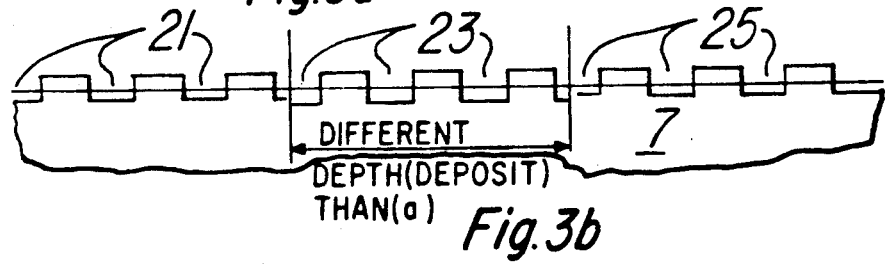
DIFFERENT DEPTH(DEPOSIT) THAN(a)
Fig.3b

REAL-TIME, IN-SITU SAW FILTER DELAY ADJUSTMENT

BACKGROUND OF THE INVENTION

1. Field of the Invention

This invention relates to a process for in-situ, real-time fine delay adjustment of individual packaged surface acoustic wave (SAW) devices.

2. Brief Description of the Prior Art

In the surface acoustic wave art, there is a need for precision delay and narrow band filter requirements. Many systems, such as, for example, missile seeker subsystems, require multiple signal channels which amplitude and phase track over the military specification temperature range, usually −55° C. to +100° C. Compact IF filters in each of these channels must be of the highest performance and uniformity. Such filters must also amplitude and phase track to within 0.5 dB and 2.0 degrees, respectively across the 3 dB bandwidth.

Standard fabrication tolerances (metal thickness and electrode width) are unable to produce devices which meet these requirements. For post-mounted center frequency adjustment, several manufacturers deposit non-piezoelectric materials on the surface to slow the surface wave. These in-situ approaches are not applicable to device fabrication in which the SAW devices must track amplitude and phase responses over mil-spec temperature range, usually −55° C. to +100° C. Most deposited layers have temperature coefficients of delay which differ from the substrate. Hence these procedures are not applicable.

SUMMARY OF THE INVENTION

In accordance with the present invention, the above described yield problem is substantially minimized and there is provided a process of forming SAW devices which are highly uniform from device to device. Two fabrication processes are shown, one to adjust center frequency (amplitude and phase) and the second to adjust only delay (phase only). These post-mounting and post-matching processes are real-time, in-situ and utilize direct measurements of the affected parameters in an operator controlled feedback loop.

Briefly, the device is partially fabricated whereby it includes input and output transducers and an optional waveguide region between the transducers. The transducers are composed of electrodes, preferably of aluminum, on a piezoelectric substrate, preferably quartz. A matching network may be included, attached between each transducer and the input and output ports. An automatic network analyzer is connected to the input and output ports.

The center frequency is lowered by decreasing the transducer region velocity. This is effected by forming grooves in the substrate between adjacent electrode elements of the input and output electrodes and the optional waveguide portion of the substrate, which is the portion between the input and output electrodes. The electrodes act as an etch stop for the region of the substrate thereunder. The partially fabricated device is then placed in a zero insertion force fixture in a plasma reactor. The device is then etched with an appropriate substrate etchant, preferably with a $CF_4$ plasma in a plasma chamber, while the transducers (or optional matching networks) are connected to a standard automatic network analyzer. Etching continues until the desired center frequency is achieved. Etching then stops. The center frequency will not change as long as the input transducer and grooves therebetween are not changed.

In accordance with a second embodiment, a quartz substrate has input and output transducer electrodes formed thereon as in the first embodiment and grooves are etched in the substrate between the transducer electrodes as in the first embodiment as well as in the waveguide portion. A mask or grating is then placed over the entire device which exposes the waveguide portion of the substrate which is that portion between input and output transducer electrodes. The mask is designed to expose the grooves (which may or may not be present) in only the waveguide portion with major axis of each groove normal to the direction of wave travel along the waveguide portion of the substrate. The grating which is provided in the region between the input and output transducers serves two purposes, the first being to confine the surface wave to the region covered by the grating, thereby reducing diffraction loss and preserving the uniform, plane wave nature of the generated wave, and the second being that the grating serves as a novel mask for grooving only the propagation region substrate, thereby enabling adjustment of the delay independently of the center frequency.

The waveguide portion of the substrate is then etched with an appropriate etchant, preferably $CF_4$, in the manner described above, while an appropriate RF input signal is applied across the input transducer electrodes with matching network, if any, by the RF generator and the output from the output transducer electrodes with matching network, if any, is analyzed by a standard automatic network analyzer which monitors the RF response and delay. The etching of grooves in the waveguide region through the mask continues until the grooves are sufficiently deep so that the desired delay has been obtained as measured by the analyzer. The analyzer may have stored therein, for example, a response curve which is constantly being compared to the output of the device 1 until there is a match. Etching then stops or is then stopped and the remainder of the device fabrication steps are completed.

The substrate etching involves a uniform, full-device, plasma induced (from about 10 to about 15 watts, 12 watts preferred) dry etching with $CF_4$ at from about 100 to about 200 mTorr, with a preferred pressure of 150 mTorr to form the above described grooves in the quartz substrate, either between all transducer electrodes and waveguide region or only the waveguide region. All etch sequences are followed by a 30 second oxygen clean at 110 mTorr at 100 watts. Other appropriate etchants, times, etc. can be used as is well known in the art, the particular etch step not forming a part of this invention. The input and output electrodes and waveguide metallization are not affected by the etching procedure and act as a mask therefor. This "grooving" slows the acoustic wave. Transducer center frequency is proportional to velocity, hence the center frequency also decreases at about 150 to 225 ppm/minute, depending upon the plasma RF power. This applies only for the initial etch for input and output electrodes, not for the oxygen clean.

BRIEF DESCRIPTION OF THE DRAWINGS

FIG. 1a is a top schematic view of a SAW device in accordance with the present invention;

FIG. 1b shows a mask used in making the device of FIG. 1a.

FIGS. 2a and 2b are schematic cross sectional views of a SAW device in accordance with the present invention before and after etching for frequency adjustment; and FIGS. 3a and 3b are schematic cross sectional views of a SAW device in accordance with the present invention before and after waveguide etching.

DESCRIPTION OF THE PREFERRED EMBODIMENT

Referring first to FIG. 1a, there is shown a standard SAW device 1 having an input generator 3 for generating RF energy at the center frequency across aluminum input transducer electrodes 5, which are optionally, for example, spaced ¼ wave length about and disposed on a quartz substrate 7 (not shown in FIG. 1). The alternating electric field produced in the input transducer 5 sets up a mechanical wave (depicted as 9 in FIG. 1) which propagates down the substrate 7. The aluminum output transducer 11 is weighted by having a different amount of electrode overlap from electrode element to electrode element. This overlap causes the output to have a certain frequency response.

Also, there is a known relationship between frequency, velocity of the wave and wavelength wherein the frequency is equal to velocity divided by the wavelength. Since the electrodes of transducers 5 and 11 are fixed, the only way to change frequency is to change the velocity of the wave under the active electrodes (input and output transducer). This is accomplished, as shown in FIG. 2a, by providing a substrate 7 having the input transducer 5 and an output transducer 11 thereon. The partially completed device of FIG. 2a then has grooves 13 etched into the substrate 7 between the electrodes of the transducers 5 and 11 and along the waveguide portion 15 of the substrate to cause a slowing down of the acoustic wave as it travels from the input transducer to the output transducer.

In order to adjust the phase only, the delay is adjusted in the waveguide portion 15 of the substrate between the input and output electrodes separately. Grooves are initially etched across the entire device as shown in FIG. 3(a) including the grooves 21 which form the input transducer, the grooves 23 in the waveguide portion and the grooves 25 which form the output transducer. The depth of the grooves in the waveguide portion 23 only is then further etched while the device response (delay) is monitored by an automatic network analyzer. Since the grooves in the transducer portion of the device are not further etched, the frequency of the device remains constant. The waveguide portion is then etched still further with a mask 27, as shown in FIG. 1b, thereover until the desired values are read on the analyzer. Etching then ends and the device is removed from the plasma chamber for completion of the device.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of adjusting the delay of a SAW device comprising the steps of:
   (a) providing a substrate capable of propagating a surface acoustic wave thereon having an input transducer portion on one end portion thereof, an output transducer portion on the opposite end portion thereof and a waveguide portion therebetween;
   (b) masking said input and output transducer portions and providing a masked pattern over said waveguide portion exposing part of said waveguide portion;
   (c) applying an RF input signal to said input transducer and providing an indication of the output obtained from said output transducer; and
   (d) etching the exposed part of said waveguide portion with an etchant until said indication has reached a predetermined value.

2. The method of claim 1 wherein said input and output transducers comprise spaced electrodes on the surface of said substrate and providing grooves in said substrate between said electrodes of predetermined depth.

3. The method of claim 1 further including initially providing spaced grooves in said waveguide portion in step (a) having a major axis normal to the path of travel of an acoustic wave on said substrate and wherein step (d) comprises further etching of said grooves in said waveguide portion.

4. The method of claim 1 wherein said substrate is quartz.

5. The method of claim 1 wherein said input and output transducers comprise spaced aluminum electrodes on the surface of said substrate.

6. The method of claim 4 wherein said input and output transducers comprise spaced aluminum electrodes on the surface of said substrate.

7. The method of claim 6 wherein said etchant is a $CH_4$ plasma.

8. The method of claim 2 wherein said substrate is quartz.

9. The method of claim 2 wherein said electrodes are aluminum.

10. The method of claim 8 wherein said electrodes are aluminum.

11. The method of claim 10 wherein said etchant is a $CH_4$ plasma.

12. The method of claim 3 wherein said substrate is quartz.

13. The method of claim 3 wherein said input and output transducers comprise spaced aluminum electrodes on the surface of said substrate.

14. The method of claim 12 wherein said electrodes are aluminum.

15. The method of claim 14 wherein said etchant is a $CH_4$ plasma.

* * * * *